United States Patent
Lu et al.

(10) Patent No.: US 7,482,632 B2
(45) Date of Patent: Jan. 27, 2009

(54) LED ASSEMBLY AND USE THEREOF

(75) Inventors: Ming Lu, Sijhih (TW); Kai Chiu Wu, Tsuen Wan (HK); Zhikuan Zhang, Sai Kung (HK); Enboa Wu, Irvine, CA (US)

(73) Assignee: Hong Kong Applied Science and Technology Research Institute Co., Ltd., Hong Kong (CN)

( * ) Notice: Subject to any disclaimer, the term of this patent is extended or adjusted under 35 U.S.C. 154(b) by 109 days.

(21) Appl. No.: 11/492,837

(22) Filed: Jul. 26, 2006

(65) Prior Publication Data

US 2008/0013334 A1      Jan. 17, 2008

Related U.S. Application Data

(60) Provisional application No. 60/830,110, filed on Jul. 12, 2006.

(51) Int. Cl.
     *H01L 29/18*      (2006.01)
(52) U.S. Cl. .......................................... 257/88; 257/99
(58) Field of Classification Search ................. 257/88, 257/99, 712; 362/545
See application file for complete search history.

(56) References Cited

U.S. PATENT DOCUMENTS

| | | | |
|---|---|---|---|
| 5,577,832 A | 11/1996 | Lodhie | |
| 6,598,996 B1 * | 7/2003 | Lodhie | 362/249 |
| 6,609,816 B2 | 8/2003 | Ansari et al. | |
| 6,815,724 B2 * | 11/2004 | Dry | 257/88 |
| 6,827,469 B2 | 12/2004 | Coushaine et al. | |
| 6,880,956 B2 | 4/2005 | Zhang | |
| 6,991,355 B1 | 1/2006 | Coushaine et al. | |
| 7,040,790 B2 | 5/2006 | Lodhie et al. | |
| 7,252,405 B2 * | 8/2007 | Trenchard et al. | 362/235 |

FOREIGN PATENT DOCUMENTS

| | | |
|---|---|---|
| CN | 1464953 | 12/2003 |
| CN | 2644878 | 9/2004 |
| JP | 2006-049026 | 2/2006 |
| JP | 2006-100052 | 4/2006 |
| WO | WO 2006/027883 | 3/2006 |

OTHER PUBLICATIONS

International Search Report Application No. PCT/CN2007/070176 dated Aug. 2, 2007.

* cited by examiner

*Primary Examiner*—Mark Prenty
(74) *Attorney, Agent, or Firm*—Buchanan Ingersoll & Rooney PC

(57) ABSTRACT

A light emitting diode (LED) assembly includes a first substrate carrying a first plurality of LEDs mounted thereon and a second substrate spaced apart from the first substrate. The second substrate carries a second plurality of LEDs thereon. The first and second substrates are thermally connected for thermal distribution between the substrates.

25 Claims, 3 Drawing Sheets

LED ASSEMBLY AND USE THEREOF

FIELD OF THE INVENTION

The present invention relates to a light emitting diode assembly with improved thermal dissipation performance.

BACKGROUND OF THE INVENTION

Light emitting diodes (LEDs) have been widely used as light sources in lighting apparatus. However, when a plurality of light sources such as LEDs, consumes electricity at the same time, the heat generated from the light sources often causes disadvantages and problems, including creation of a short circuit, thermal damages to adjacent or surrounding components. As will be thus appreciated, inefficient thermal dissipation and overheating are common drawbacks of the conventional light sources.

Heat sinks and cooling agents have been proposed in, for example, U.S. Pat. No. 6,880,956, entitled "Light source with heat transfer arrangement" and issued to Zhang on Apr. 19, 2005. However, such heat sinks and cooling agents render an LED assembly design unnecessarily complicate and bulky.

It is an object of the present invention to provide a light emitting diode assembly, which overcomes at least some of the deficiencies exhibited by those of the prior art.

SUMMARY OF THE INVENTION

According to an aspect of the present invention, a light emitting diode (LED) assembly includes a first substrate carrying a first plurality of LEDs mounted thereon and a second substrate spaced apart from the first substrate. The second substrate carries a second plurality of LEDs thereon. The first and second substrates are thermally connected for thermal distribution between the substrates.

According to a second aspect of the present invention, a light emitting diode (LED) assembly includes
  a plurality of substrates, wherein each substrate carries a plurality of LEDs thereon, and wherein each substrate is spaced apart from an adjacent substrate; and
  a plurality of thermal conductive projections between each pair of adjacent substrates for spacing apart the adjacent substrates and for thermally connecting the adjacent substrates to allow thermal distribution among the plurality of substrates.

According to a further aspect of the present invention, a light source includes:
  a light emitting diode (LED) assembly, having
    a plurality of substrates each carrying a plurality of LEDs thereon,
    wherein each substrate is spaced apart from an adjacent substrate and is in thermal communication with an adjacent substrate in a manner so as to allow heat distribution between the substrates; and
  electrical connections for connecting the LED assembly to a power source.

Other aspects and advantages of the invention will become apparent from the following detailed description, taken in conjunction with the accompanying drawings, which description illustrates by way of example the principles of the invention.

BRIEF DESCRIPTION OF THE DRAWINGS

Exemplary embodiment of the present invention now will be described, by way of example only, and with reference to the accompanying drawings in which:

FIG. 1b is a top plan view of the assembly of FIG. 1a;

FIG. 1c is a side view of the assembly of FIG. 1a;

FIG. 1e is a top plan view of a upper LED layer of the assembly of FIG. 1a.

DETAILED DESCRIPTION

As shown in FIGS. 1a-d, an exemplary light emitting diode (LED) assembly embodiment 100 according to the present invention has a multi stack of four LED substrates 101, 201, 301, 301 and a pair of electrical substrates 501, 601 substantially parallel to each other and stacked along an axis 701 being substantially perpendicular to and passing though centers (not shown) of the layers. In the exemplary embodiment, each layer has a substantially circular shape, but it will be understood that different shapes will be equally applicable depending upon the required application of the assembly.

Figure 1A:
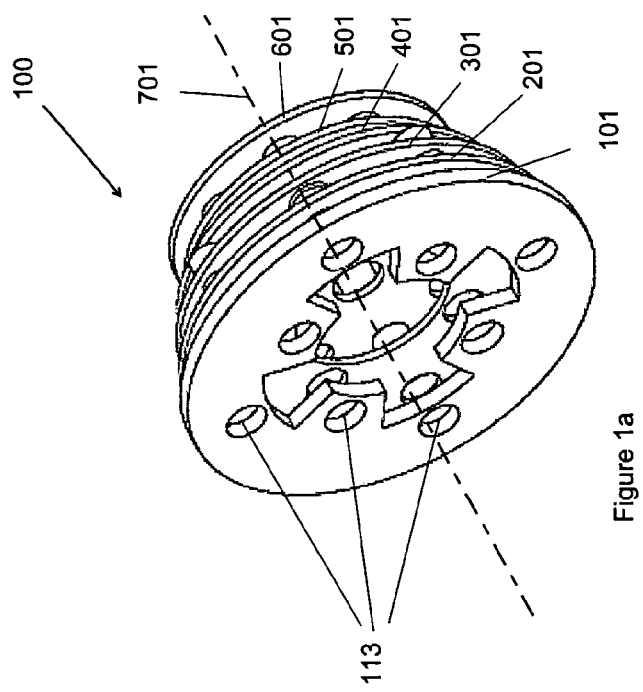
FIG. 1a is a perspective view of an exemplary light emitting diode assembly embodiment of the present invention.
Figure 1B:
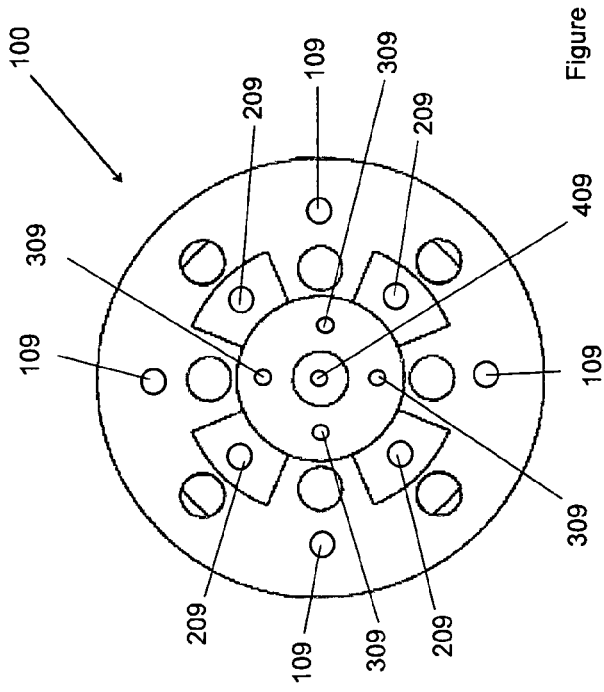

Each LED substrate 101, 201, 301, 401 is substantially planar having an upper surface 105, 205, 305, 405 and a lower surface 107, 207, 307, 407. LEDs 109, 209, 309, 409 are mounted on the respective upper surfaces 105, 205, 305, 405 and emit lights in a substantially unanimous light emitting direction (not shown) substantially parallel to axis 701 and from electrical substrate 601 towards LED substrate 101 in the exemplary embodiment when powered up. As indicated in FIG. 1b, the LEDs on various LED layers are offset radially and/or circumferentially or in other suitable arrangements such that the LEDs do not block each other in the light emitting direction. Further, recesses 117, 119, 217, 317 can be created on LED substrates 101, 201, 301 for allowing lights from LEDs to pass through the various layers and out of the assembly. As shown in FIG. 1b, when the assembly 100 is viewed in a direction from LED substrate 101 towards electrical substrate 601, the LEDs 109, 209, 309, 409 are not blocked by each other or the substrates. Alternatively, transparent substrates may be used for enhancing light emission efficiency in other or alternate embodiments.

In the exemplary embodiment, each substrate 101, 201, 301, 401, 501, 601 is formed from thermal conductive material such as metal-core printed circuit board (MC-PCB) or ceramic based substrate, for assisting heat distribution in each substrate. The MC-PCBs or ceramic based substrates are patterned to provide electrical paths (not shown) thereon for powering the LEDs as generally understood by those skilled in the art. Alternatively, PCBs may be formed from materials of relatively lower thermal conductivity such as epoxy resin (FR-4, FR-5) and bismaleimide-triaze (BT).

Figure 1C:
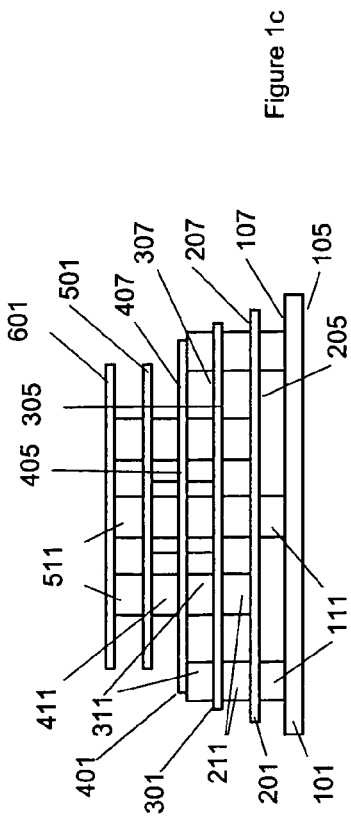
Figure 1D:
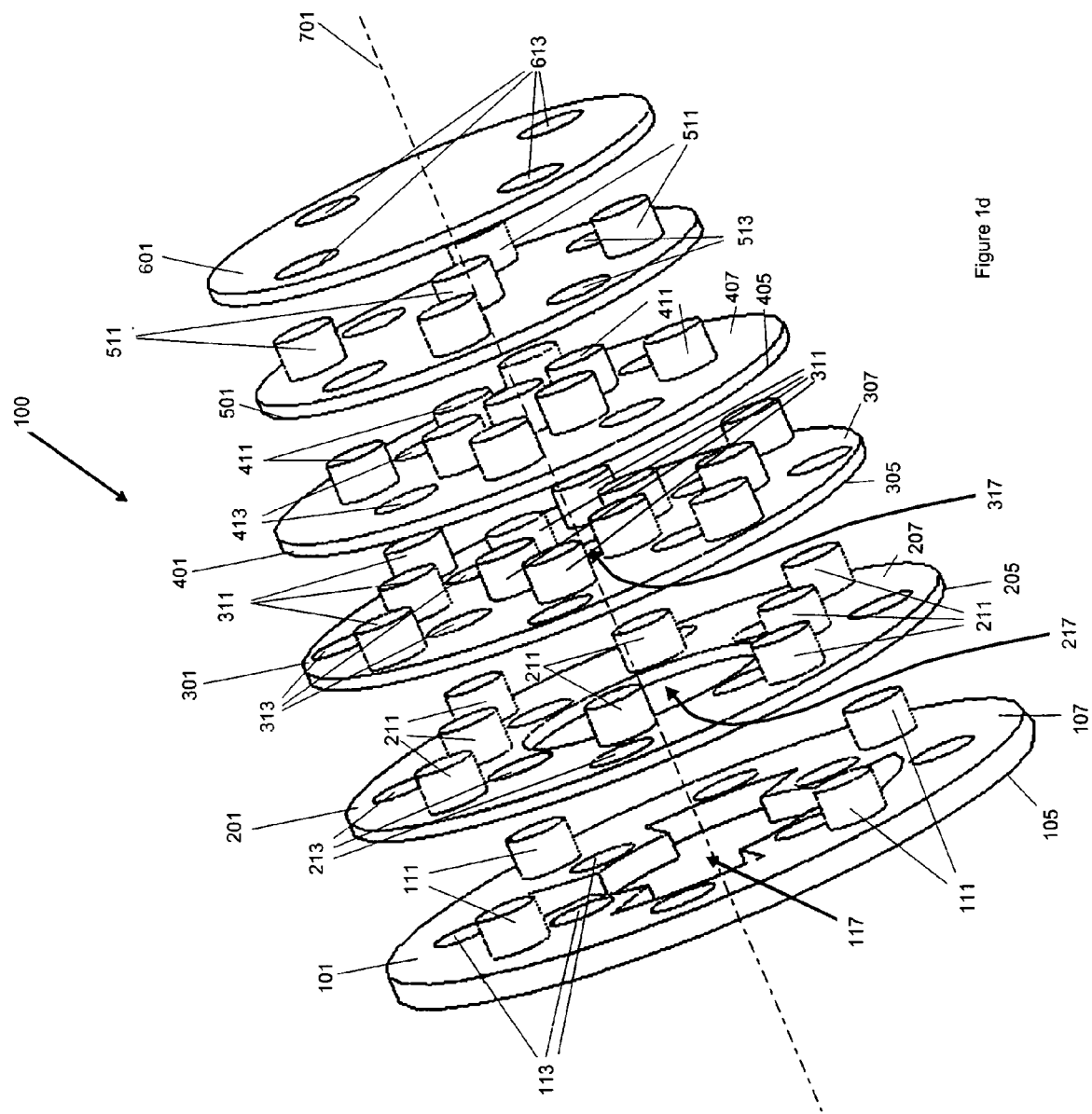
FIG. 1d is an exploded perspective view of the assembly as depicted in FIG. 1a from the rear of the assembly.
Figure 1E:
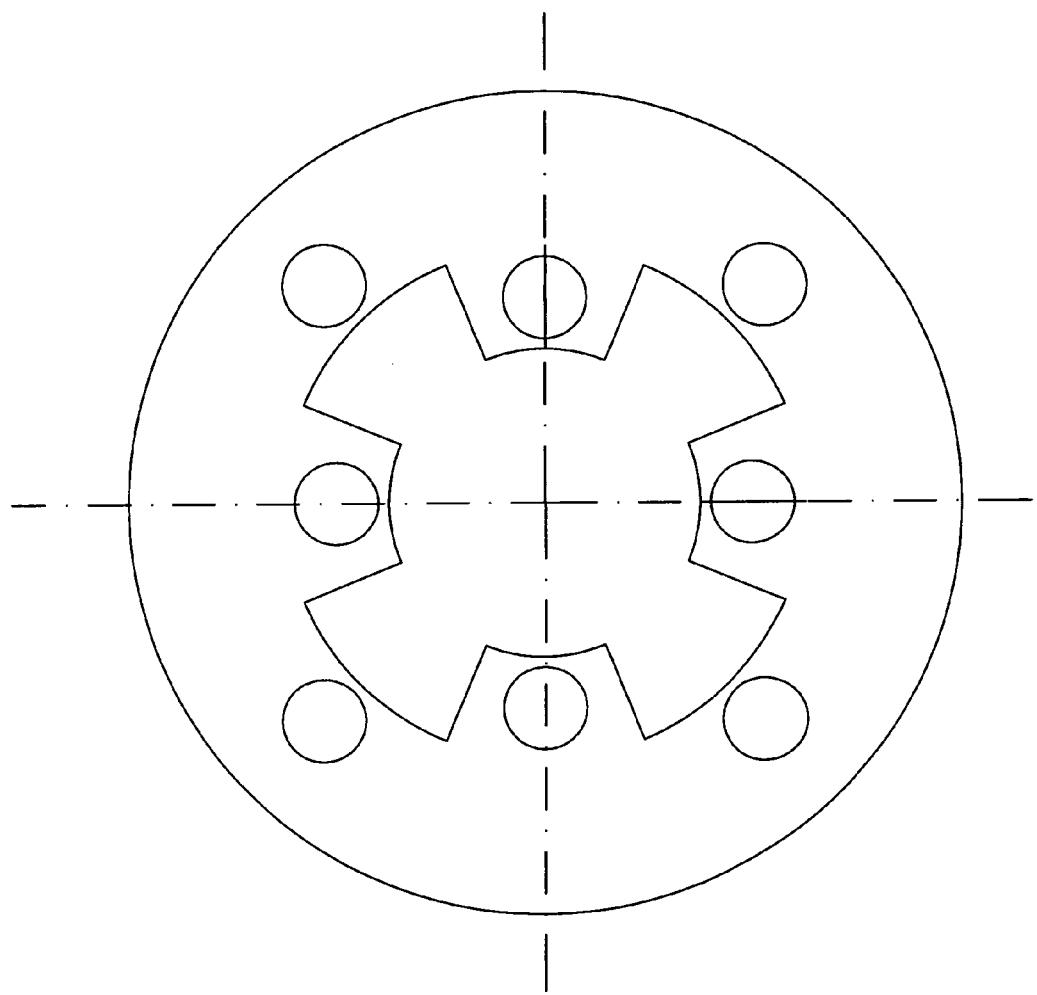

Thermal conductive projections, for example, metal columns 111, 211, 311, 411, 511, are provide between adjacent LED and/or electrical substrates as shown in FIGS. 1c and 1d for physically spacing apart the adjacent substrates along the axis 701. The metal columns also physically and thermally connect the substrates so as to distribute heat generated by the LEDs among all the substrates. In the exemplary embodiment, the metal columns are attached to the LED or electrical substrates by thermal conductive glues for allowing efficient thermal conductions between the substrates. It will be understood that other fastening mechanisms such as bolts, studs, nuts, screws and the like may also be used. Furthermore, the projections may be formed from metal alloy or ceramic materials.

With the substrates physically spaced apart by a gap, more efficient thermal dissipation from the substrate to the environment, for example air surrounding the substrates, can be achieved. With the substrates thermally connected, heats will be transferred from a substrate of a higher temperature to a substrate of a lower temperature, and therefore more even thermal distribution among the substrates can be achieved. This may further enhance the thermal dissipation efficiency.

In the exemplary embodiment, apertures 113, 213, 313, 413, 513, 613 are created on and passes though each substrate 101, 201, 301, 401, 501, 601 for enhancing air flow through the substrates. At least a number of the apertures on various substrates are aligned along axes substantially parallel to axis 701 for reducing the resistance to air-flow through the substrates. Therefore the apertures may improve the natural convection of the air flow and consequently enhance the thermal dissipation efficiency of the assembly 100.

A socket, although not shown in the present drawings, may be provided on electrical layer 601 for receiving cables so as to connect the assembly 100 to an external power source, also not shown. Alternatively, batteries can be used as the power source for the assembly. Furthermore, wires or other electrical connections (not shown) are provided to electrically connect the various LED substrates to the electrical contract substrates 501, 601 as will be understood in the art.

By arranging the LEDs on a plurality of physically spaced apart but thermally connected LED substrates, the exemplary LED assembly embodiment may achieve an improved thermal dissipation performance without the need of heat sinks or cooling agents. Therefore a relatively compact sized LED assembly can be provided by the present invention.

Furthermore, the exemplary LED assembly may offer greater flexibility in designing light emission patterns by three-dimensionally arranging the LEDs on various substrates.

In another exemplary embodiment, a light source such as a lamp, again not shown, may include an LED assembly as described above and electrical connections for connecting the LED assembly to a power source. A transparent cap may be provided for covering at least part of the LED assembly as will be understood by those skilled in the art.

Alternatives may be made to the exemplary embodiments described above. For example, the substrates may be non-parallel to each other; the substrates may be non-planar for example in a concave shape; the substrates may not need to be aligned with each other; some LEDs may be mounted on the lower surface or along a circumference of the substrate(s) with one or more reflectors nearby redirecting the light emissions from these LEDs.

Furthermore, the LED assembly may be an integral structure formed by firstly casting or sintering a thermal conductive material to produce a unitary structure integrating the substrates and projections as generally understood by those skilled in the art. Subsequently dielectric layers are laid on the substrate surface(s), where the electric circuits and LEDs can be put on. Such an integral structure reduces the solid-solid interfaces between the substrates and projections and therefore will further improve the thermal conduction between the various substrates.

It will be understood that the invention disclosed and defined herein extends to all alternative combinations of two or more of the individual features mentioned or evident from the text or drawings. All of these different combinations constitute various alternative aspects of the invention. The foregoing describes an embodiment of the present invention and modifications, apparent to those skilled in the art can be made thereto, without departing from the scope of the invention.

Although the invention is illustrated and described herein as embodied, it is nevertheless not intended to be limited to the details described, since various modifications and structural changes may be made therein without departing from the spirit of the invention and within the scope and range of equivalents of the claims.

Furthermore, it will be appreciated and understood that the words used in this specification to describe the present invention and its various embodiments are to be understood not only in the sense of their commonly defined meanings, but also to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself. The definitions of the words or elements of the following claims are, therefore, defined in this specification to include not only the combination of elements which are literally set forth, but all equivalent structure, material or acts for performing substantially the same function in substantially the same way to obtain substantially the same result, without departing from the scope of the invention.

What is claimed is:

1. A light emitting diode (LED) assembly, comprising:
a first substrate carrying a first plurality of LEDs mounted thereon, and
a second substrate spaced apart from the first substrate, the second substrate carrying a second plurality of LEDs mounted thereon,
the first substrate including a plurality of apertures thereon for allowing air flow therethrough such that the first and second substrates are thermally connected for thermal distribution between the substrates; and
wherein each of the LEDs on the first substrate is offset by a distance from a corresponding LED on the second substrate, and wherein the plurality of apertures disposed on the first substrate are each substantially aligned with a corresponding LED mounted on the second substrate for allowing light emissions from the LEDs on the second substrate to pass through the first substrate.

2. The assembly of claim 1, further comprising a gap between opposed inwardly facing surfaces of the substrates.

3. The assembly of claim 1, wherein at least one of the substrates is formed from thermal conductive material.

4. The assembly of claim 3, wherein the at least one substrate is a metal-core printed circuit board or a ceramic-based substrate.

5. The assembly of claim 1, wherein centers of the first and second substrates are substantially aligned in a light emitting direction.

6. The assembly of claim 1, wherein the first substrate is in front of the second substrate in a light emitting direction.

7. The assembly of claim 1, wherein the second substrate includes a plurality of apertures for allowing air flow therethrough.

8. The assembly of claim 7, wherein at least a number of the corresponding apertures on the first and second substrates are substantially aligned with each other.

9. The assembly of claim 1, further comprising at least one projection extending between the first and second substrates for maintaining physical separation therebetween,
wherein the projection is formed from thermal conductive material for providing thermal conduction between the first and second substrates.

10. The assembly of claim 9, wherein the projection is formed from metal, metal alloy, ceramic material or a combination thereof.

11. The assembly of claim 9, wherein the projection is attached to at least one of the substrates by a thermally conductive glue.

12. The assembly of claim 9, wherein the substrates and projection are integrated to form a unitary structure.

13. The assembly of claim 1, wherein the substrates are substantially planar and substantially parallel to each other.

14. The assembly of claim 13, wherein each substrate has an upper surface and an opposed lower surface, and wherein the first and second plurality of LEDs are mounted on or adjacent the first and second upper surfaces respectively.

15. A light emitting diode (LED) assembly, comprising
a plurality of substrates, wherein each substrate carries a plurality of LEDs thereon, and wherein each substrate is spaced apart from an adjacent substrate; and
a plurality of thermal conductive projections between each pair of adjacent substrates for spacing apart the adjacent substrates, and a plurality of apertures disposed on an upper substrate for allowing air flow therethrough such that the adjacent substrates are thermally connected to allow thermal distribution among the plurality of substrates;
wherein the LEDs are offset when projected along a light emitting direction onto the upper substrate for minimizing blocking of light emissions, and wherein the plurality of apertures disposed on the upper substrate allows light emissions from the LEDs on the other substrates to pass through the upper substrate.

16. The assembly of claim 15, wherein each substrate and its adjacent substrate include opposed inwardly facing surfaces to define a gap therebetween.

17. The assembly of claim 15, wherein the substrates are substantially parallel to each other.

18. The assembly of claim 15, wherein each substrate is formed from thermal conductive material.

19. The assembly of claim 18, wherein each substrate is a metal-core printed circuit board or a ceramic-based substrate.

20. The assembly of claim 15, wherein at least a number of the apertures on each substrate are substantially aligned.

21. The assembly of claim 15, wherein each projection is formed from metal, metal alloy, ceramic material or a combination thereof.

22. The assembly of claim 15, wherein each projection is attached to its corresponding substrates by using thermal conductive glue.

23. The assembly of claim 15, wherein each substrate is substantially planar and has an upper surface and an opposed lower surface, and wherein the LEDs are mounted on or adjacent each corresponding upper surface respectively.

24. The assembly of claim 15, wherein the substrates and projections are integrated to form a unitary structure.

25. A light source, comprising:
a light emitting diode (LED) assembly, having
electrical connections for connecting the LED assembly to a power source;
a plurality of substrates including a first substrate and a substrate adjacent to the first substrate, each of the first and adjacent substrates having a plurality of LEDs disposed thereon,
the first substrate being spaced apart from the adjacent substrate, and a plurality of apertures being disposed on the first substrate such that the first substrate is in thermal communication with the adjacent substrate in a manner so as to allow heat distribution between the substrates; and
wherein the LEDs disposed on the first and adjacent substrates are offset when projected along a light emitting direction from the adjacent substrate towards the first substrate whereby light emissions from the adjacent substrate directed towards the first substrate are able to pass through the plurality of apertures disposed on the first substrate.

* * * * *